(12) United States Patent
Liu

(10) Patent No.: US 9,064,729 B2
(45) Date of Patent: Jun. 23, 2015

(54) JUNCTION-LESS TRANSISTORS AND FABRICATION METHOD THEREOF

(71) Applicant: Semiconductor Manufacturing International (Shanghai) Corporation, Shanghai (CN)

(72) Inventor: Jinhua Liu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/188,789

(22) Filed: Feb. 25, 2014

(65) Prior Publication Data

US 2015/0091091 A1 Apr. 2, 2015

(30) Foreign Application Priority Data

Sep. 29, 2013 (CN) .......................... 2013 1 0460185

(51) Int. Cl.
*H01L 29/66* (2006.01)
*H01L 29/06* (2006.01)
*H01L 29/423* (2006.01)
*B82Y 10/00* (2011.01)
*H01L 29/10* (2006.01)
*H01L 29/78* (2006.01)

(52) U.S. Cl.
CPC ........ *H01L 29/105* (2013.01); *H01L 29/66484* (2013.01); *H01L 29/7831* (2013.01)

(58) Field of Classification Search
CPC ................... H01L 29/78696; H01L 29/66477; H01L 29/42392; H01L 29/66772; H01L 21/823807; H01L 27/0922; H01L 29/78654; H01L 27/1203; H01L 29/66439; H01L 29/0673; H01L 29/775; H01L 29/66795; H01L 29/66545; H01L 29/0665; B82Y 10/00; B81C 1/00134
USPC .......................................... 438/136, 186, 188
See application file for complete search history.

(56) References Cited

U.S. PATENT DOCUMENTS

| 8,679,902 | B1 * | 3/2014 | Basker et al. .................. 438/142 |
| 2006/0024874 | A1 * | 2/2006 | Yun et al. ....................... 438/197 |
| 2007/0004124 | A1 * | 1/2007 | Suk et al. ....................... 438/238 |
| 2008/0135949 | A1 * | 6/2008 | Lo et al. ......................... 257/401 |
| 2010/0155827 | A1 * | 6/2010 | Kim et al. ...................... 257/327 |
| 2010/0207208 | A1 * | 8/2010 | Bedell et al. .................. 257/346 |
| 2010/0264492 | A1 * | 10/2010 | Surdeanu et al. ............. 257/348 |
| 2011/0062417 | A1 * | 3/2011 | Iwayama et al. ................ 257/24 |
| 2011/0062421 | A1 * | 3/2011 | Iwayama et al. ................ 257/29 |

(Continued)

*Primary Examiner* — Jarrett Stark
*Assistant Examiner* — Bitew Dinke
(74) *Attorney, Agent, or Firm* — Anova Law Group, PLLC

(57) ABSTRACT

A method is provided for fabricating a junction-less transistor. The method includes providing a semiconductor substrate having a dielectric layer; and forming a semiconductor layer including a first heavily doped layer formed on the dielectric layer, a lightly doped layer formed on the first heavily doped layer and a second heavily doped layer formed on the lightly doped layer. The method also includes etching the semiconductor layer and the dielectric layer to form trenches to expose side surfaces of a portion of the semiconductor layer and a portion of the dielectric layer; and removing the portion of the dielectric layer between the adjacent trenches to form a chamber. Further, the method includes forming a gate structure around the portion of the semiconductor layer between the adjacent trenches; and forming a source region and a drain region in the semiconductor layer at both sides of the gate structure.

12 Claims, 8 Drawing Sheets

(56) References Cited

U.S. PATENT DOCUMENTS

| | | |
|---|---|---|
| 2012/0138888 A1* | 6/2012 | Chang et al. .................... 257/9 |
| 2012/0217479 A1* | 8/2012 | Chang et al. ................... 257/24 |
| 2013/0078777 A1* | 3/2013 | Cheng et al. ................. 438/291 |
| 2013/0153997 A1* | 6/2013 | Chang et al. ................. 257/334 |
| 2014/0021443 A1* | 1/2014 | Yu et al. ......................... 257/24 |
| 2014/0087526 A1* | 3/2014 | Basker et al. ................. 438/157 |
| 2014/0217502 A1* | 8/2014 | Chang et al. ................. 257/347 |
| 2014/0353574 A1* | 12/2014 | Li et al. ............................ 257/9 |

* cited by examiner

JUNCTION-LESS TRANSISTORS AND FABRICATION METHOD THEREOF

CROSS-REFERENCES TO RELATED APPLICATIONS

This application claims the priority of Chinese patent application No. 201310460185.X, filed on Sep. 29, 2013, the entirety of which is incorporated herein by reference.

FIELD OF THE INVENTION

The present invention generally relates to the field of semiconductor technology and, more particularly, relates to junction-less transistors and fabrication techniques thereof

BACKGROUND

With the continuous development of semiconductor process technology, technology nodes have become smaller and smaller; and requirements on materials have become higher and higher. In an existing field-effect transistor (FET), doping type and doping concentration of the source region and the drain region are different from doping type and concentration of the channel region, thus PN junctions are formed between the source/drain regions and the channel region. With the continuous shrinkage of the critical dimension of semiconductor devices having PN junctions, problems including threshold voltage drifting and leakage current increasing, etc., have become more and more obvious. Thus, novel device structures, such as silicon on insulator, double-gate, triple-gate, or circular gate, etc., have been developed. These novel structures are used to prevent undesired effects, such as short-channel effects, etc.

Areas of the source region, the drain region and the channel region of the FET are reduced because of the continuous shrinkage of the FET. Thus, it may increase difficulties to control the doping process to form the source region, the drain region and the channel region, etc.; and forming PN junctions between the source region and the channel region and between the drain region and the channel region becomes more and more difficult. Therefore, junction-less transistors, which have a same doping type for source regions, drain regions and channel regions, have been developed to overcome abrupt-doping-change problems of the PN junctions. Further, the junction-less transistors are also be able to prevent the short-channel effect, thus the junction-less transistors with a size of a few nanometers may still function well.

However, resistances of the channel regions of the junction-less transistors may be relatively large; and may affect their performance. The disclosed device structures and methods are directed to solve one or more problems set forth above and other problems.

BRIEF SUMMARY OF THE DISCLOSURE

One aspect of the present disclosure includes a method for fabricating a junction-less transistor. The method includes providing a semiconductor substrate having a dielectric layer; and forming a semiconductor layer including a first heavily doped layer formed on the dielectric layer, a lightly doped layer formed on the first heavily doped layer and a second heavily doped layer formed on the lightly doped layer on the semiconductor substrate. The method also includes etching the semiconductor layer and the dielectric layer to form trenches to expose side surfaces of a portion of the semiconductor layer and a portion of the dielectric layer; and removing the portion of the dielectric layer between the adjacent trenches to form a chamber. Further, the method includes forming a gate structure around the portion of the semiconductor layer between the adjacent trenches; and forming a source region and a drain region in the semiconductor layer at both sides of the gate structure.

Another aspect of the present disclosure includes a junction-less transistor. The junction-less transistor includes a substrate having a dielectric layer; and a semiconductor layer having a first heavily doped layer formed on the dielectric layer, a lightly doped layer formed on the first heavily doped layer and a second heavily doped layer formed on the lightly doped layer formed on the dielectric layer. The junction-less transistor also includes a gate structure covering side surfaces, a top surface and a bottom surface of a portion of the semiconductor layer. Further, the junction-less transistor includes a source region and a drain region formed in the semiconductor layer at both sides of the gate structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 14:
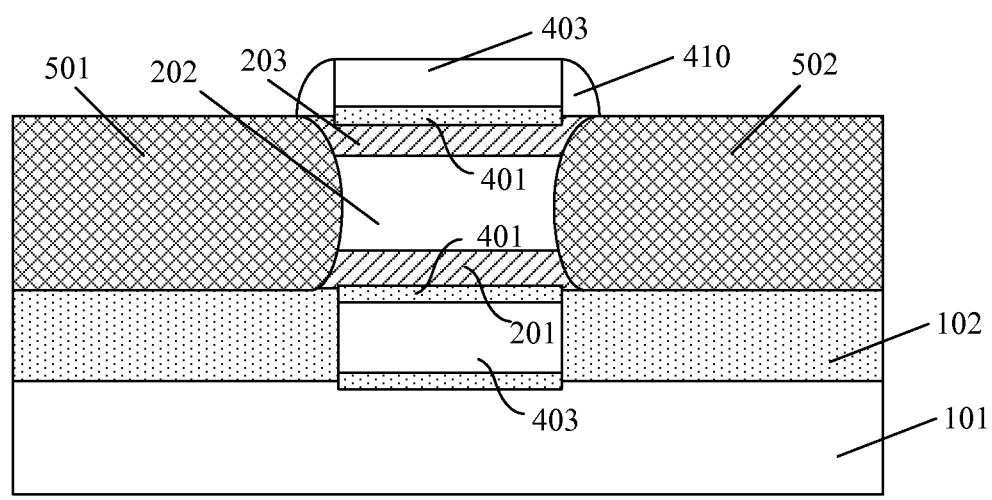
Figure 15:
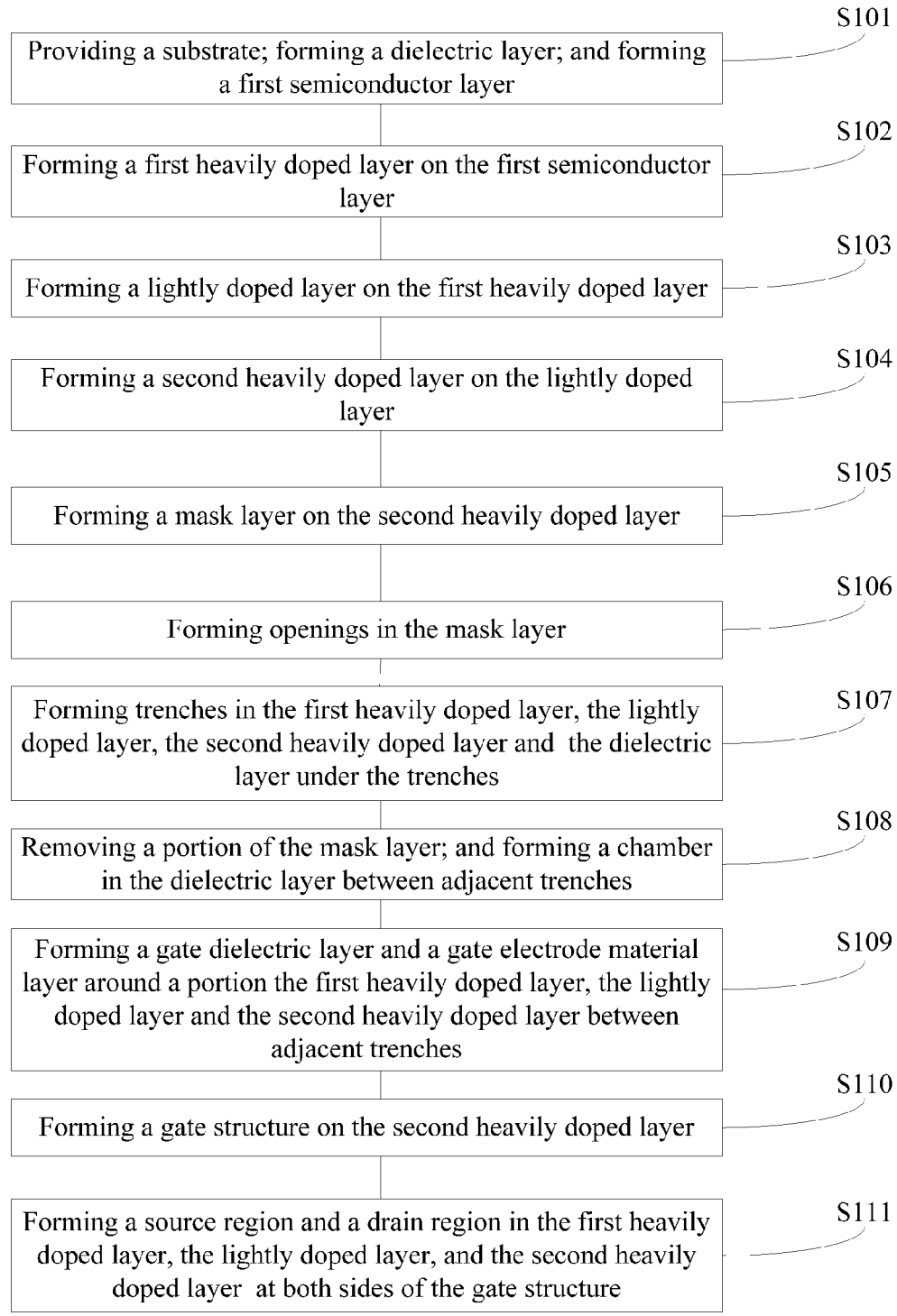
FIG. 15 illustrates an exemplary fabrication process of a junction-less transistor consistent with the disclosed embodiments.

FIG. 15 illustrates an exemplary fabrication process of a junction-less transistor; and FIGS. 1-14 illustrate exemplary semiconductor structures corresponding to various stages of the fabrication process.

Figure 1:
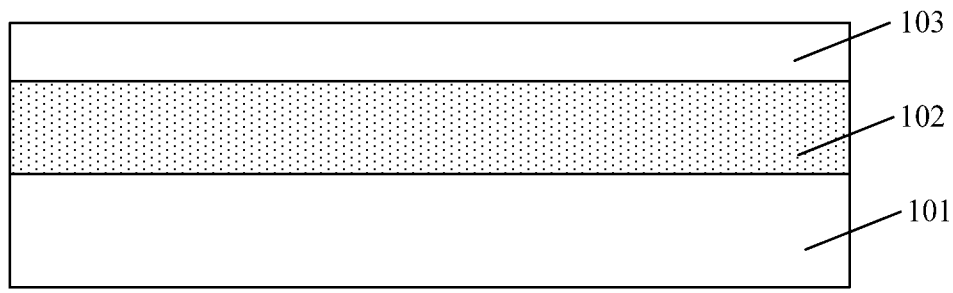
FIGS. 1-14 illustrate semiconductor structures corresponding to certain stages of an exemplary fabrication process of a junction-less transistor consistent with the disclosed embodiments.

As shown in FIG. 15, at the beginning of the fabrication process, a substrate with certain structures is provided (S101). FIG. 1 illustrates a corresponding semiconductor structure.

As shown in FIG. 1, a substrate 101 is provided. A dielectric layer 102 may be formed on one surface of the substrate 101; and a first semiconductor material layer 103 may be formed on the dielectric layer 102.

The substrate 101 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite, ally semiconductor or a combination thereof. The substrate 101 may be selected according to a subsequently formed semiconductor device. In one embodiment, the substrate 101 is silicon. The substrate 101 provides a base for subsequent processes and structures.

The dielectric layer 102 may be made of any appropriate material, such as silicon oxide, silicon oxynitride, or silicon oxynitride, etc. The material of the dielectric layer 102 may have an etching selectivity with the material of the substrate 101. In one embodiment, the dielectric layer 102 is made of silicon oxide.

Various processes may be used to form the dielectric layer 102, such as a chemical vapor deposition (CVD) process, a physical vapor deposition (PVD) process, an atomic layer deposition (ALD) process, or a flowable chemical vapor deposition (FCVD) process, etc.

The first semiconductor material layer 103 may be made of any appropriate material, such as silicon, silicon germanium, carborundum, indium antimonide, lead telluride, indium arsenide, indium phosphide, gallium arsenidie, gallium antimonite, ally semiconductor or a combination thereof. The first semiconductor material layer 103 may be made of a material same the substrate 101. The first semiconductor material layer 103 may also be made of a material different from the substrate 101.

Various processes may be used to form the first semiconductor material layer 103, such as a chemical vapor deposition (CVD) process, a physical vapor deposition (PVD) process, an atomic layer deposition (ALD) process, an epitaxial growth process, or a flowable chemical vapor deposition (FCVD) process, etc.

In one embodiment, an SOI wafer may be used as a substrate for forming the junction-less transistor. Thus, the bottom silicon layer of the SOI wafer may be referred to the substrate 101; the buried oxide layer (isolator) of the SOI wafer may be referred to the dielectric layer 102; and the top silicon layer of the SOI wafer may be referred to the first semiconductor material layer 103.

When the SOI wafer is used to form transistors, parasitic capacitances of the transistors may be reduced; switch speeds of the transistors may be increased; and power consumptions of the transistors may be reduced.

Figure 2:
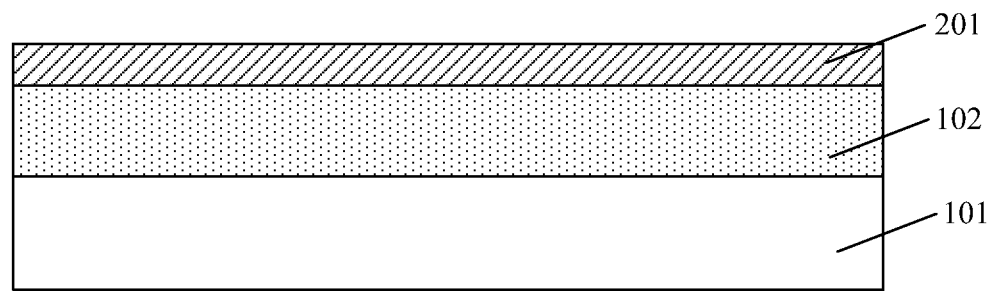
Figure 3:
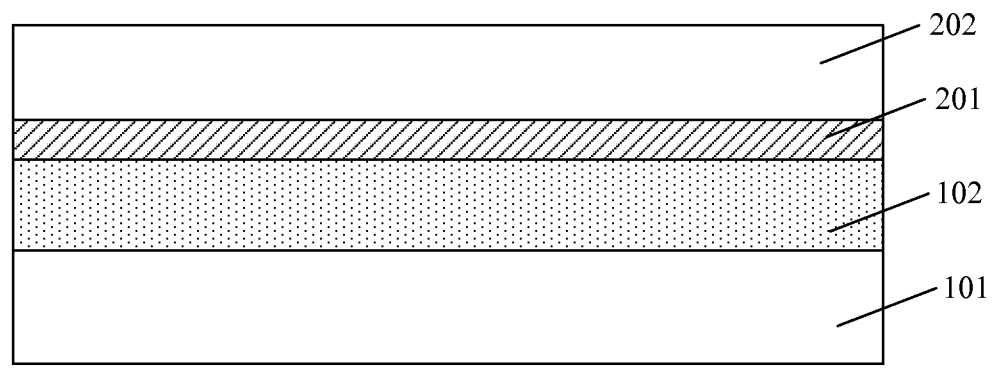
Figure 4:
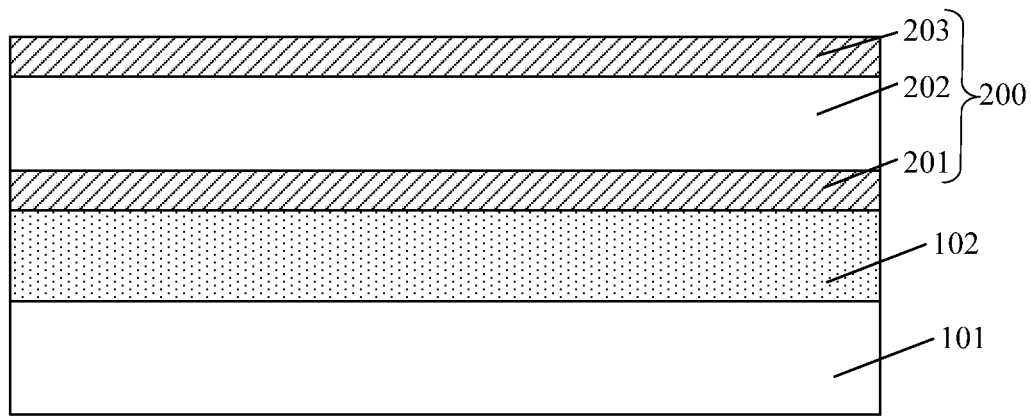

Returning to FIG. 15, after providing the substrate 101 having the dielectric layer 102 and the first semiconductor layer 103, a semiconductor layer having a sandwich doping profile may be formed (S102). FIGS. 2~4 illustrates a corresponding semiconductor structure.

As shown in FIG. 4, a semiconductor layer 200 is formed on the dielectric layer 202. The semiconductor layer 200 may have a first layer 201, a second layer 202 and a third layer 203. Doping concentrations of the first layer 201 and the third layer 203 may be higher than the doping concentration of the second layer 202, thus the first layer 201 may be refereed as a first heavily doped layer 201; the second layer 202 may be refereed as a lightly doped layer 202; and the third layer may be refereed as a second heavily doped layer 203. The channel region of the junction-less transistor may be subsequently formed by the semiconductor layer 200, thus the channel region of the junction-less transistor may have a sandwich doping profile. That is, the channel region may be formed by the first heavily doped layer 201, the lightly doped layer 202 on the first heavily doped layer 201, and the second heavily doped layer 203 on the lightly doped layer 202. In one embodiment, the junction-less transistor is an N-type transistor, thus the doping profile of the channel region may be referred as a $N^+/N^-/N^+$ doping profiled As shown in FIG. 2, the first heavily doped layer 201 is formed on the dielectric layer 102 (S102). The first heavily doped layer 201 may be formed by performing a first heavily doping ion implantation process onto the first semiconductor layer 103. An ion type of the first heavily doping ion implantation process may be same as a type of the subsequently formed junction-less transistor. In one embodiment, the subsequently formed junction-less transistor is an N-type transistor, thus the ions of the first heavily doping ion implantation process may include at least one of phosphorus ion, arsenic ion and antimony ion, etc.

In certain other embodiments, if the subsequently formed junction-less transistor is a P-type transistor, the ions for the first heavily doping ion implantation process may include at least one of boron ion, gallium ion and indium ion.

In certain other embodiments, the first heavily doped layer 201 may be formed by in situ doping the first semiconductor layer 103 when the first semiconductor layer 103 is being formed.

A doping concentration of the first heavily doped layer 201 may be in a range of approximately $1E10$ atom/cm$^3$~$1E21$ atom/cm$^3$. A thickness of the first heavily doped layer 201 may be in a range of approximately 2 nm~200 nm.

A chamber may be subsequently formed in the dielectric layer 102 under the first heavily doped layer 201. A portion of a subsequently formed gate structure may be formed in the chamber; and a portion of the heavily doped region 201 may be used as a channel region of the junction-less transistor. Because the doping concentration of the first heavily doped layer 201 may be relatively high, a resistance of the channel region may be effectively reduced; and the performance of the junction-less transistor may be improved.

As shown in FIG. 3, after forming the first heavily doped layer 201, the lightly doped layer 202 is formed on a surface of the first heavily doped layer 201. A process for forming the lightly doped layer 202 may include forming a second semiconductor material layer on the first heavily doped layer 201; and followed by performing a lightly doping ion implantation process on the second semiconductor material layer.

The second semiconductor material layer may be made of any appropriate material, such as Si, SiGe, or Ge, etc. In one embodiment, the second semiconductor material layer (the lightly doped layer 202) is made of Si.

Various processes may be used to form the second semiconductor material layer, such as a CVD process, a PVD process, an ALD process, an FCVD process, or an epitaxial growth process, etc.

A doping ion type of the lightly doping ion implantation process may be same as the type of the junction-less transistor. In one embodiment, the doping ions of the lightly doping ion implantation process may include at least one of phosphorus ion, arsenic ion and antimony ion, etc.

A doping concentration of the first lightly doped layer 202 may be smaller than the doping concentration of the first heavily doped layer 201. In one embodiment, the doping concentration of the lightly doped layer 202 is in a range of approximately $1E18$ atom/cm$^3$~$1E20$ atom/cm$^3$. The channel region of the junction-less transistor may be easily turned off because the doping concentration of the lightly doped layer 202 is smaller than the doping concentration of the first heavily doped layer 201.

A thickness of the lightly doped layer 202 may be greater than the thickness of the first heavily doped layer 201. In one embodiment, the thickness of the lightly doped layer 202 may be greater than twice of the thickness of the first heavily doped layer 201. The doping ions of the first heavily doped layer 201 may diffuse into the lightly doped layer 202 during a subsequent thermal annealing process. If the lightly doped layer 202 is relatively thin, the doping concentration of the lightly doped layer 202 may significantly increase after the thermal annealing process, thus a relative large doping concentration gradient may be unable to be obtained between the lightly doped layer 202 and the first heavily doped layer 201. Therefore, when the thickness of the lightly doped layer 202 is greater than the thickness of the first heavily dope layer 201, a doping concentration difference between the lightly doped layer 202 and the first heavily doped layer 201 and a doping concentration difference between the first lightly doped layer 202 and a subsequently formed second heavily doped layer may be sustained.

Further, as shown in FIG. 4, the second heavily doped layer 203 is formed on the surface of the lightly doped layer 202. The second heavily doped layer 203, the lightly doped layer 202 and the first heavily doped layer 201 may form the semiconductor layer 200.

A doping ion type of the second heavily doped layer 203 may be same as a type the junction-less transistor. In one embodiment, the doping ions of the second heavily doped layer 203 may be N-type ions including at least one of phosphorous ion, arsenic ion, and antimony ion, etc.

A doping concentration of the second heavily doped layer 203 may be greater than the doping concentration of the lightly doped layer 202. In one embodiment, the doping concentration of the second heavily doped layer 203 is in a range of approximately $1E10$ atom/cm$^3$~$1E21$ atom/cm$^3$. The doping concentration of the second heavily doped layer 203 may be same as the doping concentration of the first heavily doped layer 201. In certain other embodiments, the doping concentration of the second heavily doped layer 203 may be different from the doping concentration of the first heavily doped layer 201.

The second heavily doped layer 203 may be made of any appropriate material, such as Si, SiGe, or Ge, etc. In one embodiment, the second heavily doped layer 203 is made of Si. A thickness of the second heavily doped layer 203 may be in a range of approximately 2 nm~200 nm.

Various processes may be used to form the second heavily doped layer 203. In one embodiment, the second heavily doped layer 203 is formed by an in situ doping process. Specifically, the second heavily doper layer 203 is formed by an epitaxial growth process; and the doping ions may be introduced into the second heavily doped layer 203 during the second heavily doped layer 203 is being formed. Other appropriate processes may also be used to form the second heavily doped layer 203; and in situ dope the second heavily doped layer 203.

In certain other embodiments, a third semiconductor material layer (not shown) may be formed by an epitaxial process or other appropriate processes. Then a second heavily doping ion implantation process may be performed onto the third semiconductor material layer; and the second heavily doped layer 203 may be formed. When the second heavily doping ion implantation process is performed, a doping depth may have to be precisely controlled to ensure that the doping ions of the second heavily doping ion implantation process may be unable to diffuse into the lightly doped region 202. Thus, it may be ensure than the doping concentration of the lightly doped layer 202 is smaller than the doping concentration of the first heavily doped layer 201 and the doping concentration of the second heavily doped layer 203.

A portion of a gate structure may subsequently be formed on the top surface of the second heavily doped layer 203; and a portion of the second heavily doped layer 203 may be used as a portion of the channel region of the subsequently formed junction-less transistor. Because the doping concentration of the second heavily doped layer 203 may be relatively high, the on-resistance of the subsequently formed junction-less transistor may be effectively reduced; and the performance of the subsequently formed junction less transistor may be improved.

Figure 5:
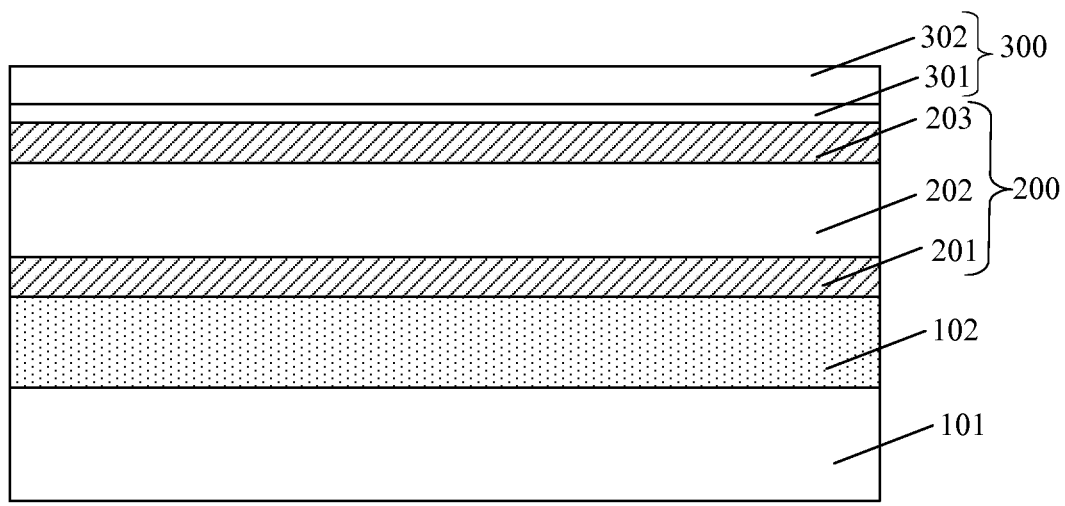

Returning to FIG. 15, after forming the semiconductor layer 200, a mask layer may be formed on the semiconductor layer 200 (S105). FIG. 5 illustrates a corresponding semiconductor structure.

As shown in FIG. 5, a mask layer 300 is formed on the semiconductor layer 200. In one embodiment, the mask layer 300 may include a first mask layer 301 formed on the surface of the second heavily doped layer 203 and a second mask layer 302. In certain other embodiments, the mask layer 300 may be triple-layer structure, or a single layer structure.

The mask layer 300 may be made of any appropriate material, such as silicon oxide, silicon nitride, or silicon oxynitride, etc. In one embodiment, the first mask layer 301 is made of silicon oxide; and the second mask layer 302 is made of silicon nitride. The first mask layer 301 made of silicon oxide may be used to reduce a crystal lattice mismatch between the second heavily doped layer 203 and the second mask layer 302 made of silicon nitride. In certain other embodiments, the mask layer 300 is a single layer structure; and the mask layer 300 may be made of silicon oxide or silicon nitride. In certain other embodiments, if the mask layer 300 is a triple-layer structure; the mask layer 300 may be a silicon nitride-silicon oxide-silicon nitride structure (may be referred as an N-S-N structure).

Various processes may be used to form the mask layer 300, such as a CVD process, a PVD process, an ALD process, or an FCVD process, etc.

Figure 6:
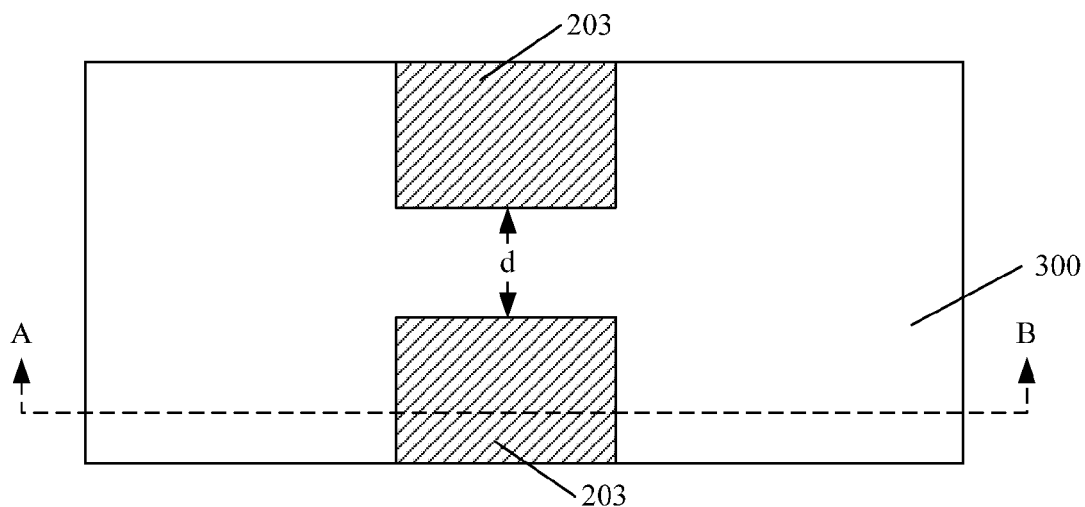
Figure 7:
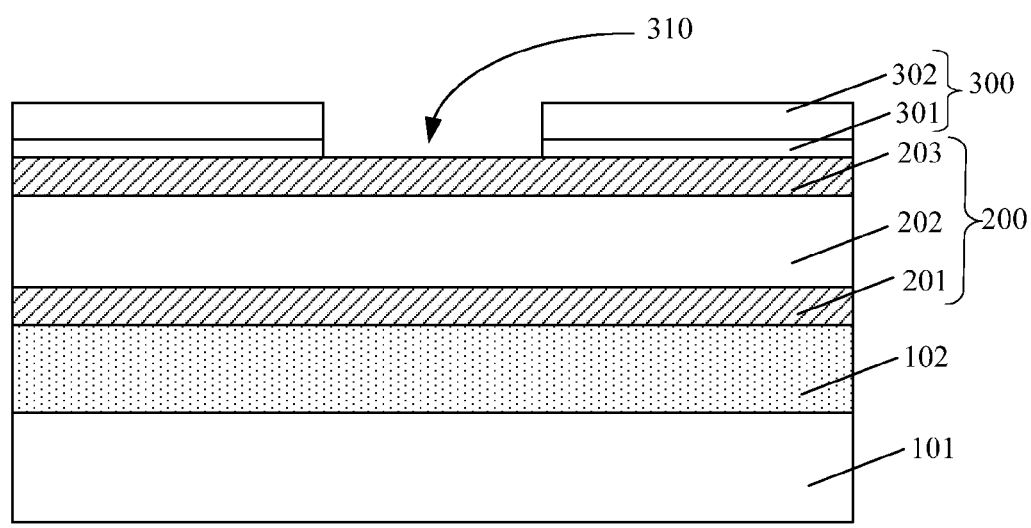

Returning to FIG. 15, after forming the mask layer 300, openings may be formed in the mask layer 300 (S106). FIGS. 6~7 illustrate a corresponding semiconductor structure. FIG. 7 illustrates a cross-section view of the semiconductor structure shown in FIG. 6 along the 'AB' direction.

As shown in FIGS. 6~7, openings 310 are formed in the mask layer 300. For illustrative purposes, two openings 310 may be used in the description. Referring to FIG. 6, a portion of the mask layer 130 may be kept between two adjacent openings 310. The openings 310 may expose a portion of the second heavily doped layer 203. The mask layer 300 with the openings 310 may be used as an etching mask to subsequently form trenches.

A distance between the two adjacent openings 310 may be referred as a 'd'. 'd' may also refer a width of the portion of the mask layer 300 between the adjacent openings 310. In one embodiment, 'd' may be in a range of approximately 10 nm~200 nm. The distance 'd' between the two adjacent openings 310 may be relatively small, the portion of the mask layer 300 between the two openings 310 may subsequently be directly removed by any appropriate process.

Various processes may be used to form the openings 310, such as a dry etching process, a wet etching process, or an ion beam etching process, etc. In one embodiment, the openings 310 are formed by a dry etching process.

Figure 8:
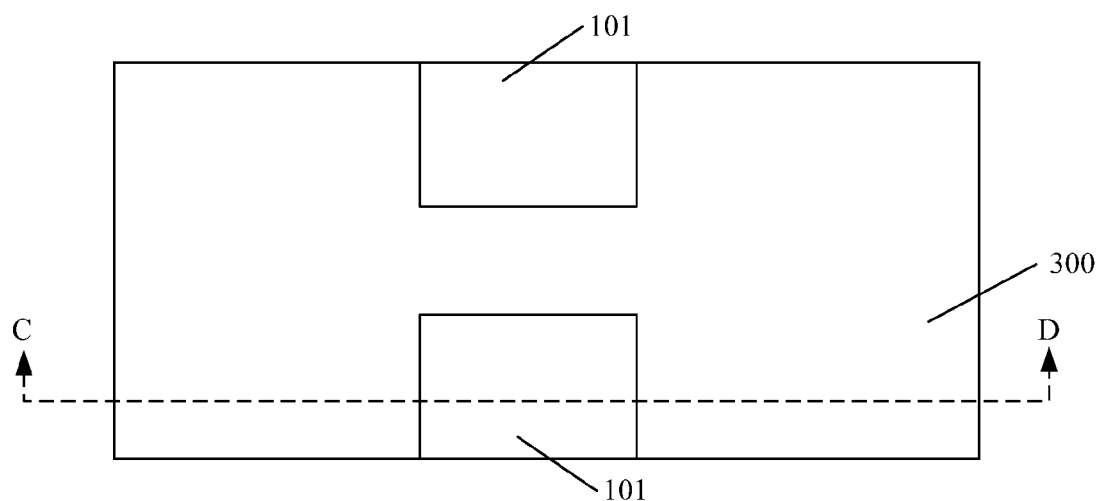
Figure 9:
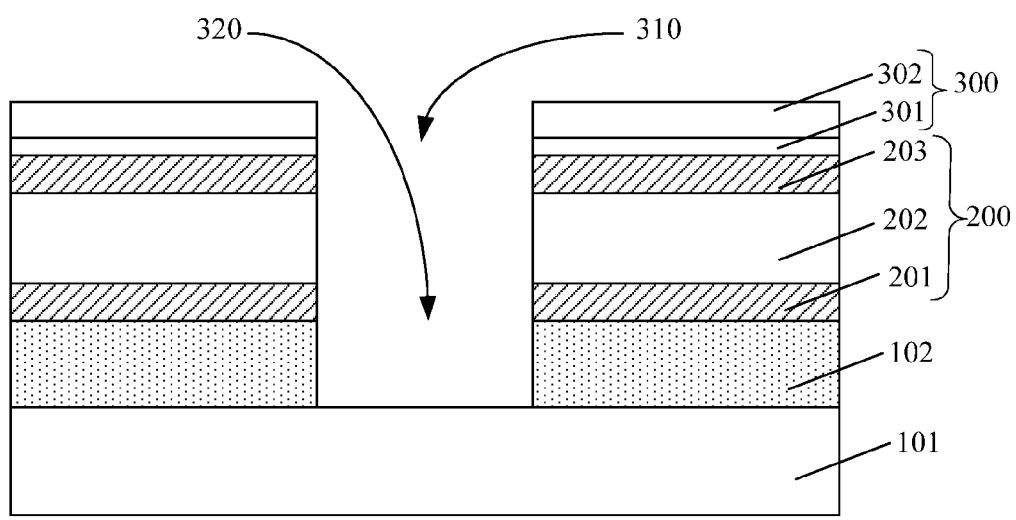

Returning to FIG. 15, after forming the openings 310, trenches may be formed (S107). FIGS. 8~9 illustrate a corresponding semiconductor structure. FIG. 9 is a cross-section view of the semiconductor structure shown in FIG. 8 along the "CD" direction.

As shown in FIGS. 8~9, trenches 320 are formed under the openings 310. The trenches 320 may be formed by etching a portion of the second heavily doped layer 203, a portion of the lightly doped region 202, a portion of the first heavily doped layer 201 and a portion of the dielectric layer 102 under the openings 310 using the mask layer 300 with the openings 310 as an etching mask until a portion of the surface of the substrate 100 is exposed. Thus, if the number of the openings 310 is two, the number of the trenches 320 are also two.

Various processes may be used to form the trenches, such as a dry etching process, a wet etching process, or an ion beam etching process, etc. In one embodiment, a dry etching process is used to etch the portion of the second heavily doped layer 203, the portion of the lightly doped region 202, the portion of the first heavily doped layer 201 and the portion of the dielectric layer 102 along the openings 310. The bottom of the trenches 320 may expose a portion of the surface of the substrate 101.

Side surfaces of the trenches 320 may expose side surfaces of the second heavily doped layer 203, the lightly doped layer 202, the first heavily doped layer 201 and the dielectric layer 102 under the portion of the mask layer 300 between the two openings 310.

Figure 10:
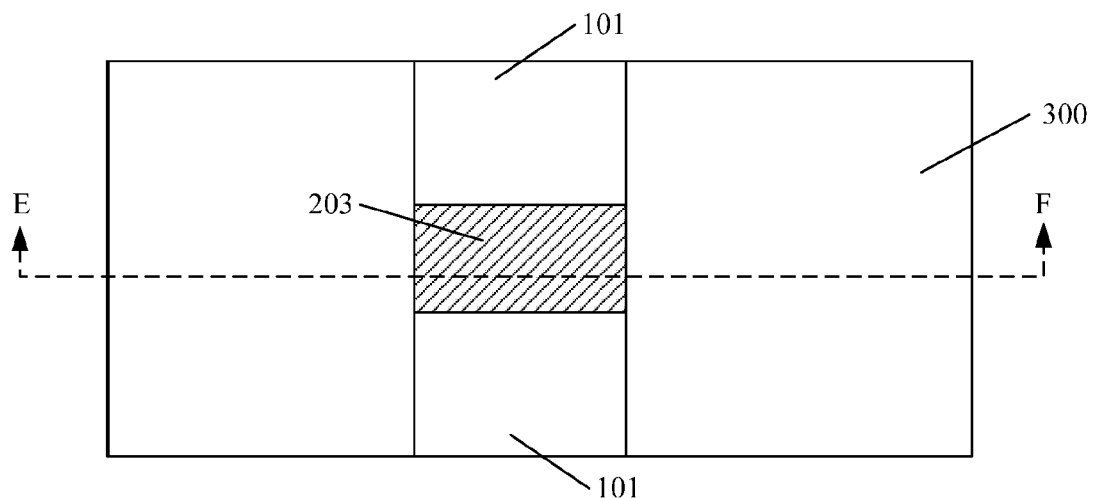
Figure 11:
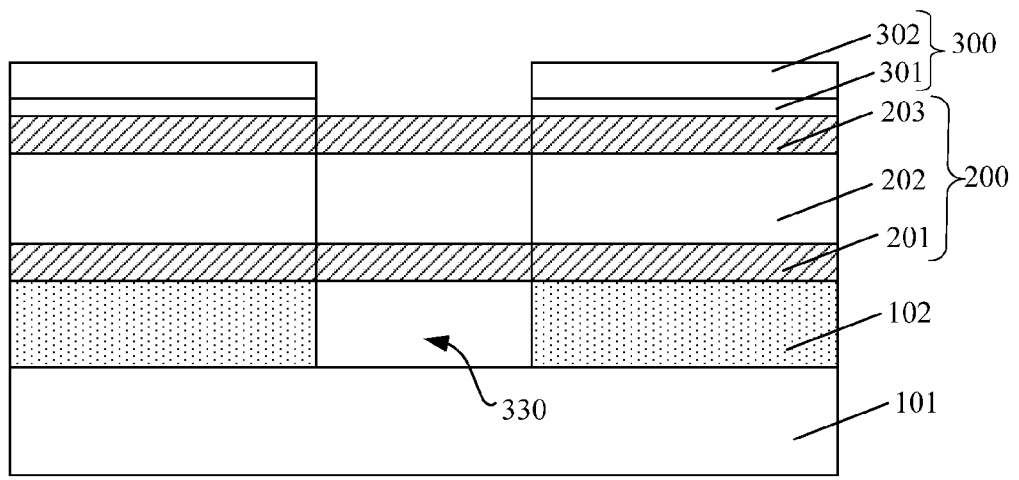

Returning to FIG. 15, after forming the trenches 320, the portion of the mask layer 300 between two adjacent openings 310 and a portion of the dielectric layer 102 between two adjacent trenches 320 may be removed; and a chamber may be formed (S108). FIGS. 10~11 illustrate a corresponding semiconductor structure. FIG. 11 is a cross-section view of the semiconductor structure illustrate in FIG. 10 along the 'EF' direction.

As shown in FIGS. 10~11, the portion of the mask layer 300 between the two adjacent openings 310 is removed; and a portion of a surface of the second heavily doped layer 203 is exposed.

Various processes may be used to remove the portion of the mask layer 300 between the two adjacent openings 310, such as a dry etching process, a wet etching process, or an ion beam etching process, etc. In one embodiment, a wet etching process is used to remove the portion of the mask layer 300. Because the width of the portion of the mask layer 300 between the two adjacent openings 310 may be relatively small, when the portion of the mask layer 300 is removed by the wet etching process, it may unlikely affect other parts of the mask layer 300.

Further, referring to FIG. 11, a portion of the dielectric layer 102 between the two adjacent trenches 320 is removed; and a chamber 330 is formed. The two adjacent trenches 320 may be connected by the chamber 330. A gate structure may be subsequently formed in the chamber 330.

Various processes may be used to remove the portion of the dielectric layer 102 between the two adjacent trenches 320 to form the chamber 330, such as a dry etching process, a wet etching process, or an ion beam etching process, etc. In one embodiment, a wet etching process is used to remove the portion of the dielectric layer 102 between the adjacent trenches 320 to form the chamber 330. In one embodiment, if the dielectric layer 102 is made of silicon oxide, an etching solution of the wet etching process may be a hydrogen fluoride solution. Other appropriate chemicals may also be used. In certain other embodiments, a dry etching process may be used to remove the portion of the dielectric layer 102.

After forming the chamber 330 and the trenches 320, side surfaces, a top surface and a bottom surface of a portion of the semiconductor layer 200 formed by the second heavily doped layer 203, the lightly doped layer 202 and the first heavily doped layer 201 may be exposed; and the portion of the semiconductor layer 200 exposed by the trenches 320 and the chamber 330 may be a fixed-fixed cantilever-like structure. A gate structure may be subsequently formed around the portion of the semiconductor layer 200, thus a contact area between the portion of the semiconductor layer 200 and the gate structure may be increased; and an area of the channel region of the junction-less transistor having a subsequently formed source region and a subsequently formed drain region in the semiconductor layer 300 and the gate structure may be increased. Therefore, the performance of the junction-less transistor may be improved.

Figure 12:
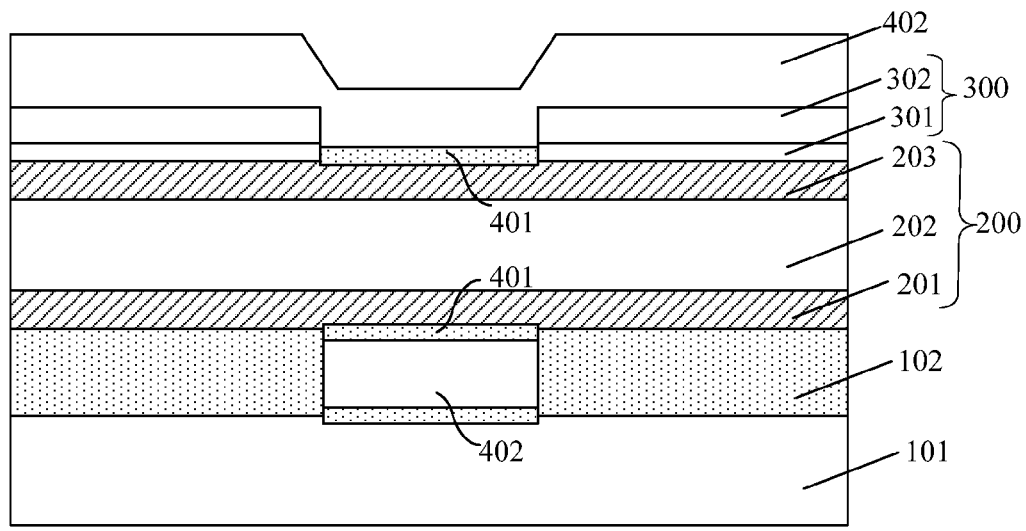

Returning to FIG. 15, after forming the chamber 330, a gate dielectric layer and a gate electrode material layer may be formed (S109). FIG. 12 illustrates a corresponding semiconductor structure.

As shown in FIG. 12, a gate dielectric layer 401 is formed on the surface of the portion of the semiconductor layer 200 between the adjacent trenches 320. That is, the gate dielectric layer 401 may formed on the side surfaces, the top surface and the bottom surface (in the chamber 330) of the portion of the semiconductor layer 200 between the adjacent trenches 320.

The gate dielectric layer 401 may be made of any appropriate material, such as silicon oxide, silicon nitride, silicon oxynitride, $HfO_2$, $La_2O_3$, HfSiON, $HfAlO_2$, $ZrO_2$, $Al_2O_3$, or $HfSiO_4$, etc. In one embodiment, the gate dielectric layer 401 is made of silicon oxide.

Various processes may be used to form the gate dielectric layer 401, such as a CVD process, an FCVD process, an ALD process, or a thermal oxidation process, etc. In one embodiment, the gate dielectric layer 401 is formed by a thermal oxidation process if the semiconductor layer 200 is made of silicon. In certain other embodiments, the gate dielectric layer 401 is formed by a CVD process.

Referring to FIG. 12, when the substrate 101 is made of silicon, when a thermal oxidation process is used to form the gate dielectric layer 401, the gate dielectric layer 401 made of silicon oxide may also be formed on a surface of a portion of the substrate 101 on the bottom of the chamber 330 and side surfaces of the trenches 320.

Further, as shown in FIG. 12, a gate electrode material layer 402 is formed on the gate dielectric layer 401. The gate electrode material layer 402 may also fill up the chamber 330 and the trenches 320. Further, the gate electrode material layer 402 may also cover the mask layer 300.

The gate electrode material layer 402 may be made of any appropriate material, such as one or more of poly silicon, Al, Cu, Ag, Au, Pt, Ni, Ti, TiN, TaN, Ta, TaC, TaSiN, W, WN and WSi, etc. In one embodiment, the gate material layer 402 is made of poly silicon.

Various processes may be used to form the gate electrode material layer 402, such as a CVD process, a PVD process, an FCVD process, or an electro chemical plating process, etc. In one embodiment, the gate electrode material layer 402 is formed by a CVD process.

Figure 13:
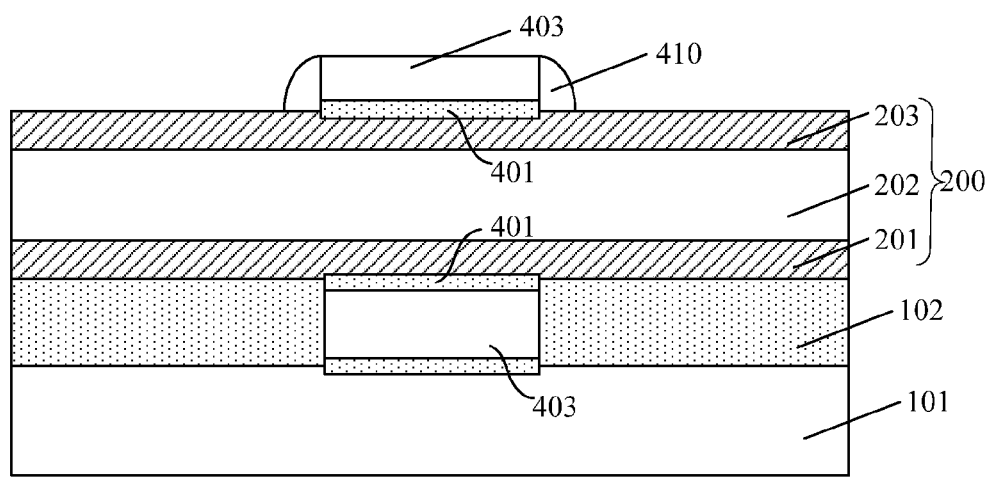

Returning to FIG. 15, after forming the gate electrode material layer 402, a gate structure may be formed (S110). FIG. 13 illustrates a corresponding semiconductor structure.

As shown in the FIG. 13, a gate structure is formed on the portion of the semiconductor layer 200 between two adjacent trenches 320. The gate structure may include a gate electrode 403, the gate dielectric layer 401 and a sidewall spacer 410. Since the gate structure may cover the top surface of the second heavily doped layer 203 and the bottom surface of the first heavily dope layer 201, the gate structure may function as two gates. Thus, the gate structure may be referred as a dual-gate structure. That is, the portion of the gate structure on the surface of the second heavily doped layer 203 may be referred as a top gate; and the portion of the gate structure on the bottom of the first heavily doped layer 201 may be a referred as a bottom gate.

The gate electrode 403 may be formed by planarizing the gate electrode material layer 402 by a chemical mechanical polishing (CMP) process, an ion beam polishing process, or any other appropriate processes using the mask layer 300 as a stop layer. Thus, a portion of the gate electrode material layer 402 on the mask layer 300 may be removed; and the gate electrode 403 may be formed.

The gate electrode 403 and the gate dielectric layer 402 may be on the surface of the portion of the semiconductor layer 200 between two adjacent trenches 320, portions of the first heavily doped layer 201 and the second heavily doped layer 203 of the semiconductor layer 200 may be used as a channel region of the junction-less transistor. The doping concentration of the first heavily doped layer 201 and the doping concentration of the second heavily doped layer 203 may be relatively high, thus an on-resistance ($R_{on}$) of the channel region of the junction-less transistor may be reduced; and the performance of the junction-less transistor may be improved. Further, the lightly doped region 202 may be formed between the first heavily doped layer 201 and the second heavily doped layer 203; and the doping concentration of the lightly doped layer 202 may be relatively small, thus the channel region of the junction-less transistor may be easy to be turned off.

Further, the gate electrode 403 and the gate dielectric layer 401 may cover the side surfaces, the top surface and the bottom surface of the portion of the semiconductor layer 200 above the chamber 330, thus the area of the channel region of the junction-less transistor may be increased; and the performance of the junction-less transistor may be further improved.

Referring to FIG. 13, after forming the gate electrode 403, the mask layer 300 may be removed; and the sidewall spacer 410 may be formed on side surfaces of a portion of the gate electrode 403 and the gate dielectric layer 401 on the second heavily doped layer 203.

The mask layer 300 may be removed by any appropriate process, such as a dry etching process, or a wet etching process, etc.

A process for forming the sidewall spacer 410 may include forming a sidewall spacer material layer on the side surfaces of the gate dielectric layer 401 and the gate electrode 403 and the top surfaces of the second heavily doped layer 203 and the gate electrode 403; and removing a portion of the sidewall spacer material layer on the surfaces of the second heavily doped layer 203 and the gate electrode 403 by a mask-less etching process (an etch back process).

The sidewall spacer 410 may be made of any appropriate material, such as silicon oxide, silicon nitride, or silicon oxynitride, etc. The sidewall spacer 410 may also be a multiple-layer structure made of different materials. In one embodiment, the sidewall spacer 410 is made of silicon nitride. The sidewall spacer 410 may be used to protect the gate electrode 403 and the gate dielectric layer 401 in subsequent processes. Further, the sidewall spacer 410 may be used as a mask layer for subsequently forming a source region and a drain region using a heavily doping ion implantation process. A distance between the source region and the drain region may be adjusted by adjusting a thickness of the sidewall spacer 410.

Various processes may be used to form the sidewall spacer material layer, such as a CVD process, a PVD process, an ALD process, or an FCVD process, etc. The mask-less etching process may include a dry etching process, a wet etching process, or an ion beam etching process, etc.

Returning to FIG. 15, after forming the sidewall spacer 410, a source region and a drain region may be formed (S111). FIG. 14 illustrates a corresponding semiconductor structure.

As shown in FIG. 14, a source region 501 and a drain region 502 are formed in the second heavily doped layer 203, the lightly doped layer 202 and the first heavily doped layer 201 at both sides of the sidewall spacer 410.

The source region 501 and the drain region 502 may be formed by an ion implantation process. A doping type of the source region 501 and the drain region 502 may be same as the doping type of the first heavily doped layer 201, the lightly doped layer 202 and second heavily doped layer 203. In one embodiment, the junction-less transistor is an N-type transistor, thus the source region 501 and the drain region 502 may be N-type doped. A doping concentration of the source region 501 and the drain region 502 may be in a range of approximately 1E18 atom/cm$^3$~1E20 atom/cm$^3$.

Thus, a junction-less transistor may be formed by the above disclosed processes and methods; and a corresponding junction less transistor is illustrated in FIG. 14. The junction-less transistor includes a substrate 101; and a dielectric layer 102 formed on the substrate 101. The junction-less transistor also includes a gate dielectric layer 401 covering side surfaces of a portion of a first heavily doped layer 201, a portion of a lightly doped layer 202, a portion of a second heavily doped layer 203, a top surface of the portion of the second heavily doped layer 203 and a bottom surface of the portion of the first heavily doped layer 201; and a gate electrode 403 formed on the surface of the gate dielectric layer 401. Further, the junction-less transistor includes a sidewall spacer formed around a portion of the gate electrode 402 and a portion of the gate dielectric layer 401 on the surface of the second heavily doped layer 203. Further, the junction-less transistor also includes a source region 501 and a drain region 502 formed in the second heavily doped layer 203, the lightly doped layer 202 and the first heavily doped layer 201 at both sides of the sidewall spacer 410. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a junction-less transistor, comprising:
    providing a semiconductor substrate having a dielectric layer;
    forming a semiconductor layer on the semiconductor substrate, wherein the semiconductor layer includes a first heavily doped layer on the dielectric layer, a lightly doped layer on the first heavily doped layer and a second heavily doped layer on the lightly doped layer;
    etching the semiconductor layer and the dielectric layer to form trenches to expose side surfaces of a portion of the semiconductor layer and to expose side surfaces of a portion of the dielectric layer and to expose the semiconductor substrate at a bottom of the trenches;
    removing the portion of the dielectric layer between adjacent trenches to form a chamber connecting adjacent trenches under the portion of the semiconductor layer;
    forming a gate structure around the portion of the semiconductor layer defined by the chamber and the adjacent trenches; and
    forming a source region and a drain region in the semiconductor layer at both sides of the gate structure, wherein the first heavily doped layer, the lightly doped layer, and the second heavily doped layer of the portion of the semiconductor layer above the chamber provide a sandwich doping profile as a channel region of the junctionless transistor.

2. The method according claim 1, wherein:
a doping concentration of the first heavily doped layer is same as a doping concentration of the second heavily doped layer; and
a doping concentration of the lightly doped layer is smaller than the doping concentration of the first heavily doped layer and the second heavily doped layer.

3. The method according to claim 1,
further including:
forming a mask layer on the semiconductor layer before forming the trenches; and
removing a portion of a mask layer between adjacent trenches to expose a surface of a portion of the second heavily doped layer after forming the trenches.

4. The method according to claim 1, wherein forming the gate
structure further includes:
forming a gate dielectric layer to cover side surfaces, a top surface and a bottom surface above the chamber of the portion of the semiconductor layer; and
forming a gate electrode on the gate dielectric layer and filling up the chamber and the Trenches.

5. The method according to claim 1, wherein:
the first heavily doped layer is made of Si, Ge, or SiGe;
the second heavily doped layer is made of Si, Ge, or SiGe; and
the lightly doped layer is made of Si, Ge, or SiGe.

6. The method according to claim 5, wherein:
a doping type of the first heavily doped layer, the lightly doped layer and the second lightly doped layer is same as a doping type of the source region and the drain region.

7. The method according to claim 2, wherein:
the doping concentration of the first heavily doped layer and the second heavily doped layer is in a range of 1E10 atom/$cm^3$ to 1E21 atom/$cm^3$; and
the doping concentration of the lightly doped layer is in a range of approximately 1E18 atom/cm to 1E20 atom/$cm^3$.

8. The method according to claim 1, wherein:
a thickness of the first heavily doped layer is in a range of approximately 2 nm to 200 nm; and
a thickness of the second heavily doped layer is in a range of approximately 2 nm to 200 nm.

9. The method according to claim 1, wherein:
the gate structure is a dual gate structure having a top gate on the top surface of the second heavily doped layer and a bottom gate on the bottom surface of the first heavily doped layer.

10. The method according to claim 8, wherein:
a thickness of the lightly doped layer is greater than twice of the thickness of the first heavily doped layer.

11. The method according to claim 1, wherein:
the semiconductor substrate and the dielectric layer have an etching selectivity.

12. The method according to claim 1, wherein:
the chamber is formed by a wet etching process.

* * * * *